US012617392B1

(12) United States Patent
Wang

(10) Patent No.: US 12,617,392 B1
(45) Date of Patent: May 5, 2026

(54) SIMULATION BUILDOUT WITH DYNAMIC TIME INTERVALS

(71) Applicant: Zoox, Inc., Foster City, CA (US)

(72) Inventor: Weifu Wang, San Mateo, CA (US)

(73) Assignee: Zoox, Inc., Foster City, CA (US)

( * ) Notice: Subject to any disclaimer, the term of this patent is extended or adjusted under 35 U.S.C. 154(b) by 161 days.

(21) Appl. No.: 18/521,688

(22) Filed: Nov. 28, 2023

(51) Int. Cl.
| | |
|---|---|
| *B60W 50/00* | (2006.01) |
| *B60W 30/09* | (2012.01) |
| *B60W 60/00* | (2020.01) |
| *G06F 30/15* | (2020.01) |

(52) U.S. Cl.
CPC ........ *B60W 30/09* (2013.01); *B60W 50/0097* (2013.01); *G06F 30/15* (2020.01); *B60W 60/0027* (2020.02); *B60W 2510/244* (2013.01); *B60W 2520/10* (2013.01)

(58) Field of Classification Search
CPC ............. B60W 30/09; B60W 50/0097; B60W 60/0027; B60W 2510/244; B60W 2520/10; G06F 30/15
See application file for complete search history.

(56) References Cited

U.S. PATENT DOCUMENTS

| | | | | |
|---|---|---|---|---|
| 11,416,959 | B1 * | 8/2022 | Tariq | G05D 1/0088 |
| 11,851,054 | B2 * | 12/2023 | Kobilarov | B60W 60/0011 |
| 12,128,887 | B1 * | 10/2024 | Kiiski | G06V 20/58 |
| 12,162,513 | B2 * | 12/2024 | Kobilarov | G01C 21/3453 |
| 12,172,672 | B1 * | 12/2024 | Schleede | G07C 5/02 |
| 2024/0062657 | A1 * | 2/2024 | Wu | B60W 30/0956 |
| 2024/0140415 | A1 * | 5/2024 | Ario | B60W 30/10 |

* cited by examiner

*Primary Examiner* — Daniel M. Robert
(74) *Attorney, Agent, or Firm* — Lee & Hayes, P.C.

(57) ABSTRACT

Techniques for accurately predicting and avoiding collisions with objects detected in an environment of a vehicle are discussed herein. A vehicle computing device can determine a trajectory for a vehicle based on vehicle state data over a simulation period including a plurality of intervals. The vehicle computing device may determine the trajectory by determining control polic(ies) for at least a part of the simulation based on a control policy interval and determine control(s) and/or updated vehicle state data for at least the part of the simulation based on a current control policy and one or more dynamic integration interval.

20 Claims, 6 Drawing Sheets

350 —↘

352

| CONTROL POLICY STEP TIMING | | | | |
|---|---|---|---|---|
| 356 — 1s | 2s | 2s | 3s | 0 |
| 358 — 10 | 10 | 4 | 3 | 0 |
| 360 — 0.1s | 0.2s | 0.5s | 1s | 0 |

354

| INTEGRATION STEP TIMING | | | | |
|---|---|---|---|---|
| 362 — 1s | 7s | 0 | 0 | 0 |
| 364 — 10 | 35 | 0 | 0 | 0 |
| 366 — 0.1s | 0.2s | 0 | 0 | 0 |

100

INPUT DATA 106

EXAMPLE:
- VEHICLE STATE DATA
- OBJECT STATE DATA
- SENSOR DATA
- MAP DATA
- MULTIPLE TRAJECTORIES

VEHICLE 102

BUILDOUT COMPONENT 104

OUTPUT DATA 108

EXAMPLE:
- COST(S) FOR POTENTIAL INTERSECTION POINT(S)
- FUTURE VEHICLE STATES
- FUTURE OBJECT STATES
- TRAJECTORY SELECTION

OBJECT 110

TRAJECTORY 116(1)

TRAJECTORY 116(2)

TRAJECTORY 118(1)

TRAJECTORY 118(2)

OBJECT 112

TRAJECTORY 122(2)

TRAJECTORY 122(1)

TRAJECTORY 122(3)

VEHICLE 102

TRAJECTORY 120

OBJECT 114

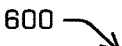

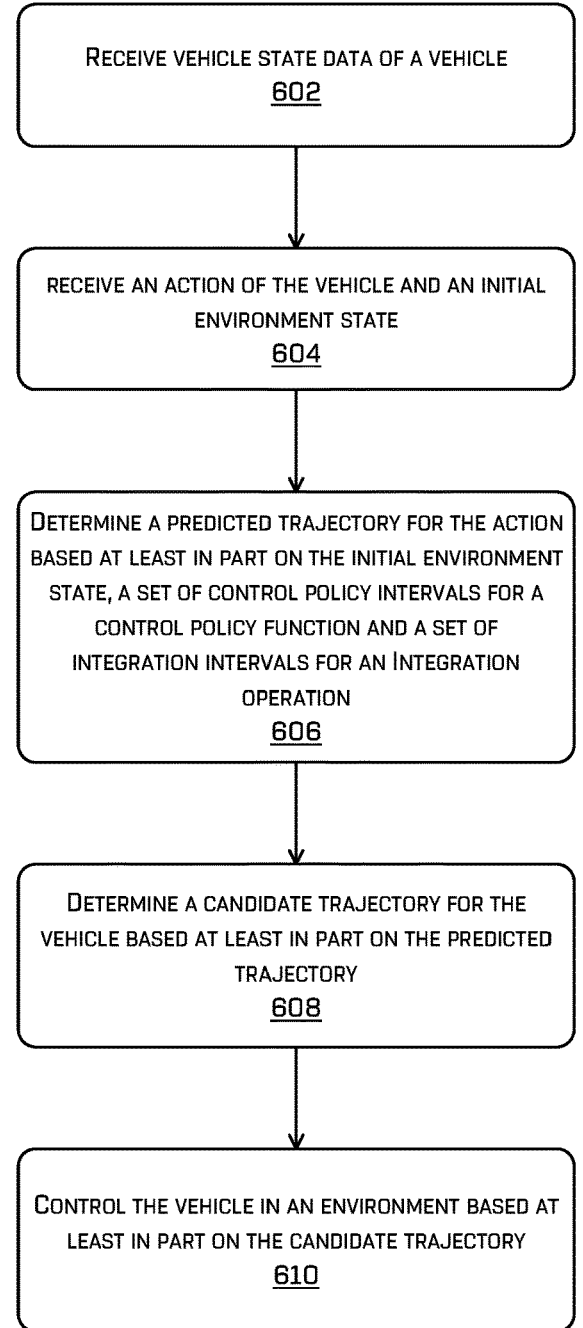

600

RECEIVE VEHICLE STATE DATA OF A VEHICLE
602

RECEIVE AN ACTION OF THE VEHICLE AND AN INITIAL
ENVIRONMENT STATE
604

DETERMINE A PREDICTED TRAJECTORY FOR THE ACTION
BASED AT LEAST IN PART ON THE INITIAL ENVIRONMENT
STATE, A SET OF CONTROL POLICY INTERVALS FOR A
CONTROL POLICY FUNCTION AND A SET OF
INTEGRATION INTERVALS FOR AN INTEGRATION
OPERATION
606

DETERMINE A CANDIDATE TRAJECTORY FOR THE
VEHICLE BASED AT LEAST IN PART ON THE PREDICTED
TRAJECTORY
608

CONTROL THE VEHICLE IN AN ENVIRONMENT BASED AT
LEAST IN PART ON THE CANDIDATE TRAJECTORY
610

FIG. 6

SIMULATION BUILDOUT WITH DYNAMIC TIME INTERVALS

BACKGROUND

Planning systems in autonomous and semi-autonomous vehicles may determine actions for a vehicle to take in an operating environment. Actions for a vehicle may be determined based in part on avoiding objects present in the environment. For example, an action may be generated by a planning system to yield to a pedestrian, to change a lane to avoid another vehicle in the road, or the like. Perception systems utilize sensor data from sensors to "see" the environment, which enables the planning systems to determine an effect of a detected object on a potential action for the vehicle.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 1 is an illustration of an example environment, in which an example vehicle applies a model to predict an intersection value indicating a likelihood for collision with one or more example objects.

FIG. 6 is a flowchart depicting an example process for controlling a vehicle based on a candidate trajectory determined using dynamic timing intervals.

DETAILED DESCRIPTION

Figure 2:
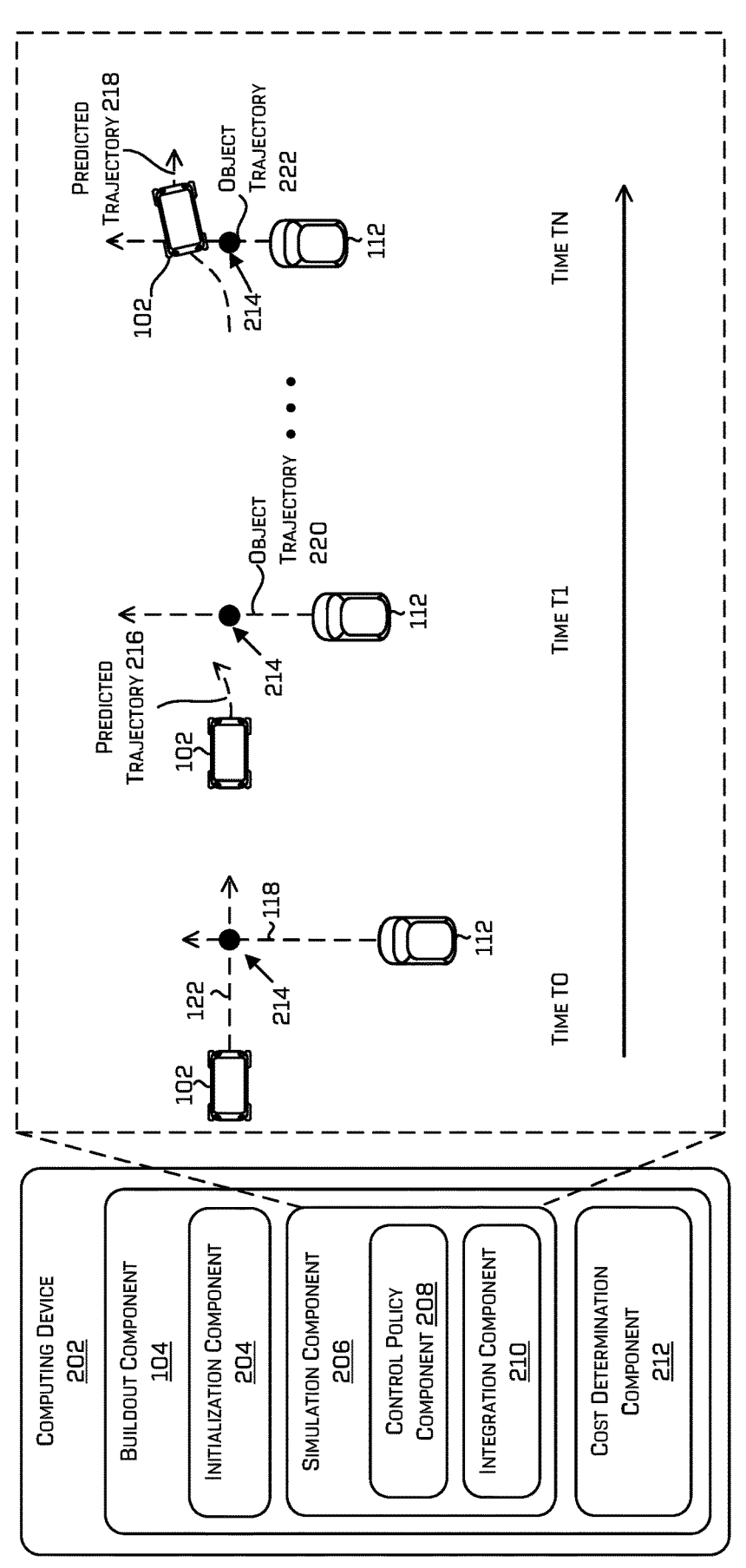
FIG. 2 is an illustration of another example environment in which one or more models determine potential vehicle states and/or object states at a future time.

Techniques for predicting trajectories of objects and/or a vehicle using dynamic time interval(s) or dynamic numbers of tick(s) (e.g., discrete step(s) in time) are discussed herein. The techniques can include a vehicle computing device that implements a model to determine realistic interactions between multiple objects and improve processing when determining an action for an autonomous vehicle. For instance, the model may receive a set of predicted object trajectories associated with an object along with one or more potential actions for the autonomous vehicle (e.g., stay in current lane, change lane to the right, change lane to the left, turn right at an intersection, pass one or more vehicles, etc.) and determine one or more predicted trajector(ies) for the potential actions based on the current state of the environment. More particularly, the model may, for an action of the autonomous vehicle, perform a simulation buildout operation to buildout a simulation for the action and/or an action which transitions from tracking a first action to a second action over a number of ticks (e.g., a simulation over 40 0.1 seconds ticks (four seconds total)). For each tick, the model may perform one, both or neither of a control policy function of a control policy component to determine control(s) for the autonomous vehicle (e.g., determine one or more of controls for the action (e.g., a steering control, a braking control, an acceleration control, and so on)) and/or perform an integration operation of an integration component to integrate the state of the environment based on the current controls output by the control policy function (e.g., to determine a next future state of the environment based on a current state and the controls determined by the control policy component). Further, a buildout component of a vehicle may use dynamic time interval(s) to determine which time steps or ticks within a simulation buildout the various operations may be performed (e.g., operations of a control policy component and an integration component). The various operations, such as operations of a control policy component and an integration component, may be performed multiple times over the course of the simulation buildout (e.g., at various ticks or points in time within the simulation buildout), resulting in a predicted trajectory or trajectories for the autonomous vehicle and other objects in the environment for the current state of the environment and the action. For example, the control policy component may operate to determine control(s) for the vehicle every four (4) ticks (e.g., at 0.4 seconds time intervals) over the eight second simulation buildout. Similarly, the integration component may determine the predicted responses of the vehicle at every two ticks (0.2 seconds) over the eight second simulation buildout. More particularly, the integration component may determine, for a current tick in the simulation buildout, the updated position of the autonomous vehicle 0.2 seconds after the previous state (e.g. the initial state or the previous integration result).

In various examples, the model may also determine costs for each vehicle action for controlling the autonomous vehicle. By implementing the techniques describes herein, future states of the object(s) and vehicle can be accurately and efficiently processed and identified, thereby improving the overall safety of the vehicle.

Generally, the model (e.g., a buildout component) implemented by the vehicle computing device may provide functionality to determine interactions between a vehicle (or an object) and another object in an environment in the future. Further, the model can predict future states of the vehicle relative to object trajectories based at least in part on a control policy (e.g., information identifying rules of the road between objects and/or the vehicle). The future states can represent the state of the vehicle for an action taken by the vehicle for different times in the future. In some examples, the vehicle can be controlled in an environment based at least in part on the data output by the model.

In some examples, a prediction component can determine predicted trajectories associated with object(s) in an environment. For example, in an environment with a vehicle (such as an autonomous vehicle), a first object, and a second object, the prediction component may determine predicted trajectories associated with each object. Further, a planning system may determine a number of potential actions associated with the vehicle. In some cases, the predicted trajectories can be based on map data and possible actions associated with the objects. However, if an object follows a first predicted trajectory (or the vehicle takes a first action), it may affect the behavior of other objects in an environment. Accordingly, techniques include determining some or all combinations of trajectories for vehicle/object pairs or object/object pairs and determining potential interactions (e.g., intersections) associated with such combinations (or a selected subset thereof). An environment can be simulated and predicted trajectories of object(s) and/or possible controls can be updated or otherwise adjusted to account for the potential interactions of the object(s) and/or vehicle, which can provide for more accurate predictions and simulations of objects in an environment.

In some examples, the model may perform the simulation buildout operations discussed herein to control a vehicle (e.g., control steering, braking, acceleration, and so on) based on object state data associated with each object and vehicle state data associated with the vehicle. For example, the model can receive the object state data (e.g., position data, orientation data, heading data, velocity data, speed data, acceleration data, yaw rate data, or turning rate data associated with the object) and/or the vehicle state data (e.g., position data, orientation data, heading data, velocity data, speed data, acceleration data, yaw rate data, or turning rate data associated with the vehicle) from a perception component of the vehicle that uses one or more sensors to detect and predict objects surrounding an environment of the vehicle.

Further, aspects of the processing operations may be parallelized and input to a parallel processor unit (such as a GPU) for efficient processing. Accordingly, implementing the techniques described herein can efficiently make use of available computational resources (e.g., memory and/or processor allocation or usage) while also improving accuracy of predictions.

As mentioned above, the model may include a control policy component and an integration component that may be utilized to generate predicted trajector (ies) for the vehicle and which may operate according to dynamic time interval(s) and. For example, the control policy component may utilize the current state of the vehicle and other objects as well as rules of the road, right of way logic, physics, kinematics, dynamics, and the like to determine one or more controls (e.g., a steering control, a braking control, an acceleration control, and so on) for controlling the vehicle (e.g., also referred to herein as performing a control policy function). The control policy component may be used to determine controls for the vehicle to implement a control policy. For example, when performing a simulation buildout for action of merging left, the control policy function may determine that merging left with the current controls may cause the vehicle to come too close to another vehicle (e.g., a state which would violate the rules of the road and/or right of way logic of the control policy function) and/or otherwise have an increased cost with respect to other actions at that time. In another example, the control policy function may modify the current control policy and/or controls based on the current controls being associated with at least a threshold probability of colliding with an object proximate the vehicle. Accordingly, the control policy component may determine one or more updated controls (e.g., a steering action, a braking action, an acceleration action, and so on) to avoid the violation of the rules of the road and/or right of way logic of the control policy function. The integration component may operate to determine the updated state of the vehicle based on the current controls output by the control policy component at the time steps or ticks determined base and, in some examples, estimated responses of the one or more objects proximate the vehicle based on the controls.

In various examples, the model may operate to perform various functions based on time intervals which include one or more time steps or ticks. More particularly, in some instances, time intervals may correspond to different periods of a time period of the simulation buildout (e.g., simulated activity every 0.1 second, 0.5, second, one second, two seconds, etc. in the simulation timeline). In an example, the model may operate at 0.1 second time steps (e.g., ten steps per second) over a period of eight (8) seconds of a simulation buildout. Each function of the model may be performed at a given time step depending on the time interval(s) of the particular function. Further, the functions of the model (e.g. the control policy function component, the integration function, etc.) may operate at different time intervals. For example, the control policy component may operate to determine controls based on one or more control policies every four (4) time steps (e.g., 0.4 seconds) over the eight second simulation buildout while the integration component may determine a next state (e.g., pose) of the vehicle based on the most recent controls every two time steps (e.g., 0.2 seconds) over the eight second simulation buildout. Further, the dynamic time intervals of the control policy component and integration component may vary over the course of the simulation buildout. For example, the dynamic time interval of the control policy component may be two time steps (0.2 seconds) for the first two seconds and five time steps (0.5 seconds) for the remaining six (6) seconds. Similarly, the integration component may have a dynamic time interval of one time step (0.1 seconds) for the first four (4) seconds of the simulation buildout and two time steps (0.2 seconds) for the remaining four (4) seconds of the eight second simulation buildout. In some examples, the dynamic time interval of the integration component and/or control policy component may increase over the course of the simulation buildout due to a weight or importance assigned to later portions of the predicted trajectory being lower than the weight or importance assigned to earlier portions of the predicted trajectory. For example, as the portion of the predicted trajectory moves further into the future, the confidence and/or reliability of the predicted trajectory may decrease. As such, the model may give a lower weight or importance to the later portions.

Moreover, the time intervals may be dynamically determined based on the circumstances of the vehicle (e.g., a number of agents proximate the vehicle or detected in perception components, an agent speed, a vehicle speed, a geolocation, a power supply state of the vehicle, a temperature of a vehicle component, another state of the vehicle, computational resources of the vehicle available, etc.). For example, the time interval of the control policy component or integration component may be increased to conserve the power supply of the vehicle. In addition or alternatively, the time interval of the control policy component or integration component may be decreased despite the power supply of the vehicle being low during a high risk situation (e.g., based on a risk assessment). As a non-limiting example of which, shorter time periods may be used for integration when in proximity of vulnerable road users (or any other object type), based on a number of proximate objects meeting or exceeding a threshold number, while performing complex maneuvers, or the like. Depending on the example, time intervals for the model may be determined upon initialization of the vehicle, at scheduled intervals, in response to events or conditions, at the beginning of each simulation buildout and so on or a combination thereof.

In some examples, the vehicle may comprise an autonomous or semi-autonomous vehicle with a vehicle computing device configured to receive sensor data from one or more sensors of the vehicle. The vehicle may detect objects using one or more sensors while navigating in the environment.

The objects may include static objects (e.g., ground level, buildings, bridges, signs, etc.) and dynamic objects such as other vehicles (e.g., cars, trucks, motorcycles, mopeds, etc.), pedestrians, bicyclists, or the like. In some examples, the objects may be detected based on sensor data from sensors (e.g., cameras, motion detectors, lidar sensors, radar sensors, etc.) of the vehicle. As yet another example, the objects may be detected based on sensor data received from remote sensors, such as, for example, sensors associated with another vehicle or sensors situated in the environment that are configured to share data with a plurality of vehicles. Sensor data representing the detected objects may be used to determine input data usable by the model to predict an intersection probability associated with the object.

In some examples, a number of combinations of object trajectories and/or object actions can be large. For example, a case where three actions are considered for a vehicle and three trajectories are considered for an object can include nine possible combinations. In some examples, potential interactions for such combinations can be determined in parallel by implementing processing in a parallel processor such as a GPU and/or in parallel by multiple GPUs thereby more efficiently processing the potential interactions in real-time.

In some examples, the vehicle computing device may generate one or more time interval data structures indicating the time intervals of one or more components or functions of the model. In some examples, the one or more time interval data structures may be utilized by one or more processors of the vehicle to align simulation buildout operations across the one or more processors. For example, the time interval data structures may be distributed to align processing in a parallel processor such as a GPU and/or in parallel by multiple GPUs thereby enabling dynamic time intervals to be used in more efficiently processing the potential interactions in real-time.

As described herein, models may be representative of machine learned models, statistical models, or a combination thereof. That is, a model may refer to a machine learning model that learns from a training data set to improve accuracy of an output (e.g., a prediction). Additionally or alternatively, a model may refer to a statistical model that is representative of logic and/or mathematical functions that generate approximations which are usable to make predictions.

The techniques discussed herein can improve a functioning of a computing device of a vehicle in a number of ways. The techniques can include the model optimizing available computational resources by performing operations while reducing the impact on the available resources and reducing latency (as compared to not implementing the model using dynamic time intervals). For example, utilizing output data from the model by a vehicle computing device, for instance, can improve the accuracy and/or reduce a latency for the vehicle to respond to a potential collision in the environment. For example, by increasing the time interval of one or more of the control policy component or integration component, the model may perform fewer computations during the simulation buildout, thereby reducing latency for the vehicle to respond to changes in the environment. Additionally or alternatively, by decreasing the time interval of one or more of the control policy component or integration component, the model may perform more computations during the simulation buildout, thereby increasing accuracy of the predicted trajectory. Further, the model may optimize power consumption and/or avoid overheating of vehicle components by dynamically increasing the time interval of one or more of the control policy component or integration component. In some examples, the model improves functioning and safety of the vehicle by preventing the vehicle from taking additional actions that are not required based on conditions in the environment around the vehicle. In addition, the techniques described herein can improve passenger comfort and/or vehicle safety such as, for example, avoiding sudden braking or swerving when not needed.

The techniques described herein can be implemented in a number of ways. Example implementations are provided below with reference to the following figures. Although discussed in the context of an autonomous vehicle, the methods, apparatuses, and systems described herein can be applied to a variety of systems and is not limited to autonomous vehicles. In another example, the techniques can be utilized in an aviation or nautical context, or in any system using sensor data. Additionally, the techniques described herein can be used with real data (e.g., captured using sensor(s)), simulated data (e.g., generated by a simulator), or any combination of the two.

FIG. 1 is an illustration of an autonomous vehicle (vehicle 102) in an environment 100, in which an example prediction model (buildout component 104) may receive input data 106 and determine output data 108. A vehicle computing device (e.g., vehicle computing device 404) and/or a remote computing device (e.g., computing device(s) 436) may implement the buildout component 104 of the vehicle 102. While described as a separate system, in some examples, the simulation buildout techniques described herein may be implemented by other vehicle systems, components, and/or computing devices. For example, and as will be described in further detail with regard to FIG. 4, the simulation buildout techniques described herein may be implemented at least partially by or in association with a localization component 420, a perception component 422, a prediction component 424, and/or a planning component 426.

In some examples, the input data 106 can comprise one or more of: vehicle state data, object state data, sensor data, map data, predicted object trajector (ies), and/or predicted vehicle trajector (ies). In such an example, the buildout component 104 may receive input data representing object state data (e.g., position data, orientation data, heading data, velocity data, speed data, acceleration data, yaw rate data, or turning rate data associated with the object) and/or vehicle state data (e.g., position data, orientation data, heading data, velocity data, speed data, acceleration data, yaw rate data, or turning rate data associated with the vehicle). In various examples, the buildout component 104 can receive map data representing static features of the environment 100 (which, in at least some examples, may also comprise designations for lane markings, lane speed, road control information—e.g., stop signs, traffic signals, crosswalks, school zones, speed bumps, and the like).

In various examples, the buildout component 104 can determine the output data 108 while the vehicle 102 navigates in the environment 100. For example, the output data 108 may represent a future state(s) of one or more objects or the vehicle 102 for different times in the future as the vehicle 102 navigates to a destination in the environment 100. In various examples, the buildout component 104 can receive the input data 106 from one or more components of the vehicle computing device and/or computing device(s) remote from the vehicle 102 and may determine actions associated with one of multiple potential trajectories associated with the input data 106.

In various examples, the vehicle computing device associated with the buildout component 104 may be configured to receive sensor data representing object(s) of the environment 100, such as via a perception component (e.g., the perception component 422). In some examples, the vehicle computing device may detect, infer, estimate, or otherwise determine object state data representing characteristics of the object in the environment 100. For example, such object state data may comprise position, velocity, acceleration, size, semantic type, etc. In some examples, the sensor(s) may include sensors mounted on the vehicle 102, and may include, without limitation, ultrasonic sensors, radar sensors, light detection and ranging (lidar) sensors, cameras, micro-phones, inertial sensors (e.g., inertial measurement units, accelerometers, gyros, etc.), global positioning satellite (GPS) sensors, and the like. In some examples, the sensor(s) may include one or more remote sensors, such as, for example, sensors mounted on another autonomous vehicle, and/or sensors mounted in the environment 100. In various examples, the vehicle 102 may be configured to transmit and/or receive data from other autonomous vehicles. The data may include sensor data and/or state data, such as sensor data associated with the environment 100. Additional examples of determining object state data and vehicle state data based on sensor data can be found in U.S. patent application Ser. No. 16/151,607, filed on Oct. 4, 2018, entitled "Trajectory Prediction on Top-Down Scenes," which is incorporated herein by reference in its entirety and for all purposes. Additional examples of tracking objects can be found in U.S. patent application Ser. No. 16/147,328, filed on Sep. 28, 2018, entitled "Image Embedding for Object Matching," which is incorporated herein by reference in its entirety and for all purposes. Additional examples of selecting bounding boxes can be found in U.S. patent application Ser. No. 16/201,842, filed on Nov. 27, 2018, entitled "Bounding Box Selection," which is incorporated herein by reference in its entirety and for all purposes As mentioned above, in various examples, the buildout component 104 can receive map data that represents fixed features of the environment such as one or more of: a roadway, an intersection, a crosswalk, a traffic signal, a centerline, a roadway boundary, a speed bump, a school zone, and so on. The map data can be received from one or more components of a vehicle computing device or remote computing device (e.g., a computing device associated with an autonomous vehicle in a fleet of vehicles or other computing device remote from the vehicle 102.)

In some examples, the vehicle computing device may be configured to detect an object in the environment 100, such as object 110 and object 112 (e.g., a vehicle), and object 114 (e.g., a pedestrian), just to name a few. In some examples, the vehicle computing device may be configured to receive, detect, infer, estimate, or otherwise determine one or more trajectories (e.g., direction, speed, acceleration, etc.), for each detected object. As shown in FIG. 1, the object 110 is associated with object trajectories 116(1) and 116(2), the object 112 is associated with object trajectories 118(1) and 118(2), the object 114 is associated with an object trajectory 120, and the vehicle 102 is associated with the vehicle trajectories 122(1) and 122(2) determined by the vehicle computing device (e.g., using the perception component 422, the prediction component 424, or another model). In some examples, the buildout component 104 may receive path information associated with the aforementioned object trajectories (e.g., 116(1), 116(2), 118(1), 118(2), 120, 122(1), and 122(2)) from a machine learned model. Though FIG. 1 shows one or two trajectories associated with the various objects, any number of objects may be detected and any number of object trajectories may be predicted for each object. Additional details of using top-down representations are described in U.S. patent application Ser. No. 16/151,607, filed on Oct. 4, 2018, entitled "Trajectory Prediction on Top-Down Scenes," which is incorporated herein by reference in its entirety and for all purposes.

In some examples, the buildout component 104 may determine potential intersection points (which may include near intersections) for one or more paths (e.g., the object trajectories 118(1) and 118(2) or other object trajectory) associated with the vehicle 112. In such examples, the intersection point(s) output by the buildout component 104 may indicate a potential intersection between the vehicle 112 and the vehicle 102 at an intersection point. Trajectories can be updated based on potential intersections. For instance, object trajector (ies) most likely to interact with the vehicle 102 can be selected for further processing, such as for performing a simulation. Further description of the buildout component 104 selecting trajectories is provided in FIG. 2, and elsewhere.

In some examples, the buildout component 104 may perform operations associated with time intervals (e.g., each tenth of a second) in the simulation buildout that represents the evolution of the environment over the time intervals (*). The computational time involved in performing the simulation buildout operation may be orders of magnitude shorter than the time intervals of the simulation buildout generated. As a non-limiting example, despite each "tick" or time interval of integration time being on the order of tenths of a second or more of simulation time, the operations may be performed in milliseconds or shorter.

In some examples, the buildout component may perform one or more operations at each tick. For example, the buildout component 104 may determine a vehicle state and/or an object state at different times in the future. The buildout component 104 may further determine one or more controls for an action of the for the vehicle 110 and how the state of the vehicle would change in the simulation over the time interval of the integration component. In a particular example, a control policy function may determine controls every five time intervals (e.g., 0.1 seconds) for an eight second simulation buildout. In some examples, after deter-mining control policies, controls and updated states for a period of the simulation buildout (e.g., one second), the updated state of the vehicle at the end of the period may be provided to a prediction component. The prediction com-ponent may utilize the updated state of the vehicle to predict changes to objects in the environment around the vehicle over a subsequent time period (e.g., from 1.0 seconds to 2.0 seconds). The buildout component 104 may then utilize the updated environment in determining the control polic (ies) and/or controls for the vehicle during the subsequent time period. This may continue until the end of the eight second simulation buildout.

In various examples, the buildout component 104 may select, determine, or otherwise predict a vehicle trajectory that the vehicle 102 may use to navigate in the environment 100 relative to one or more paths (e.g., the object trajectories 118(1) and 118(2) associated with the vehicle 112). In various examples, the output data 108 can indicate a like-lihood that the vehicle 112 may impact the safe operation of the vehicle. Additional discussion of future vehicle states and future object states can be found in FIG. 2 and else-where.

In some examples, the vehicle computing device may control the vehicle 102 in the environment based at least in part on the output data 108 (e.g., determine a candidate trajectory to avoid the objects in the environment). For instance, the buildout component 104 may provide functionality to identify objects most likely to cause an inter-section or impact the safe operation of the vehicle and communicate information about the identified objects to other components of the vehicle computing device. Accordingly, potential intersections (e.g., a probability or likelihood of an intersection between object(s) and the vehicle) or detections of objects that may impact the safe operation of the vehicle may be taken into account in operations (e.g., simulations, estimated states, interaction modeling, collision estimation, etc.) or other vehicle control planning operation (e.g., as determined by a planning component) to quickly and/or preemptively avoid objects, thereby improving safety of the vehicle. Additional detail for determining and utilizing the output data 108 are discussed throughout this disclosure. Additional details of performing simulations and/or generating trajectories are described in U.S. patent application Ser. No. 15/632,147, filed on Jun. 23, 2017, entitled "Trajectory Generation Using Temporal Logic and Tree Search," and U.S. patent application Ser. No. 15/843,512, filed on Dec. 15, 2017, entitled "Trajectory Generation Using Curvature Segments," which are incorporated herein by reference in their entirety and for all purposes.

The output data 108 from the buildout component 104 can be used by a vehicle computing device in a variety of ways. For instance, the buildout component 104 can generate a signal indicating information about the output data 108 (e.g., the costs indicative of a potential intersection) with a planning component (e.g., planning component 526) of the vehicle computing device to control the vehicle 102 in the environment 100 (e.g., determine a vehicle trajectory and/or control a propulsion system, a braking system, or a steering system). The output data 108 may also or instead be used to perform a simulation by setting up conditions (e.g., an intersection, a number of objects, a likelihood for the object to exhibit abnormal behavior, etc.) for use during the simulation (e.g., by a vehicle computing device or computing device remote from the vehicle) in order to predict motion associated with object(s) in the environment.

FIG. 2 is an illustration of an example environment 200, in which one or more models determine potential vehicle states and/or object states at a future time. For instance, the computing device 202 can implement the buildout component 104 to determine the output data 108 representing potential future states for one or more objects (e.g., the object 110, the object 112, and/or the object 114) and/or the vehicle 102. In some examples, the computing device 202 may be associated with the vehicle computing device(s) 404 and/or the computing device(s) 436.

FIG. 2 depicts the buildout component 104 comprising an initialization component 204, a simulation component 206 which further comprises a control policy component 208 and an integration component 210. FIG. 2 further depicts the buildout component 104 comprising a cost determination component 212.

In various examples, the initialization component 204 can select a potential action of the vehicle for which a trajectory is to be predicted (e.g., an action to change lanes or turn to the left (relative to the vehicle 102), travel straight, or change lanes or turn to the right, etc.) along with initial environment state data for the action and/or data regarding potential interactions between the objects and/or vehicle (e.g. an intersection of a default trajectory of the vehicle for the action with a trajectory of an object). As a non-limiting example, initial environment state data may include a state of the vehicle, a state of objects in the environment, road or driving surface data, and so on. One or more controls may be contemplated at discrete steps in the future (e.g., at fixed time, distance intervals, or some other event-based step). In some examples, a tree search can determine potential inter-actions (e.g., potential interaction 214) between object tra-jectories of different objects and/or object trajectories and vehicle trajectories, and the potential interactions deter-mined by the tree search can be used in a simulation, as further described in FIG. 2 and elsewhere.

In the illustrated example of FIG. 2, the initialization component 204 may select a travel straight action for the vehicle 102 along a trajectory 122 which has a potential interaction 214 with the object 112 (e.g. vehicle 112). The initial environment state is illustrated at time TO.

The simulation component 206 can provide functionality to simulate a predicted trajectory 216 and 218 of a vehicle for vehicle controls determined at different times in the future (e.g., over a simulation buildout). As discussed below in more detail, the simulation component 206 may represent time intervals or ticks (e.g., each tenth of a second). In some examples, the simulation component 206 may perform one or more operations for an individual time intervals. For example, the simulation component 206 may determine one or more of a control based on a control policy and/or determine an updated state of the for the vehicle 112 and/or the vehicle 102 during simulation at various time intervals (e.g., control policy time intervals and/or integration time intervals).

Vehicle controls can represent a change in vehicle state (e.g., a change in velocity, acceleration, turn rate, yaw, and so on) from a first time to a second time (e.g., during a current integration time interval). In some examples, an example vehicle control can include not changing the vehicle state (e.g., remaining in place such as staying in a lane, keeping a same steering control, braking control, and/or acceleration control). In some examples, the simula-tion component 206 can initiate an example scenario that represents the change in the vehicle state over time. In such examples, the scenario can include predictions about future positions and/or velocities of object(s) in an environment proximate to the vehicle such associated with in relation to the potential interaction 214.

In some examples, the simulation component 206 can simulate possible controls for the vehicle and/or objects over time. For instance, if a vehicle determines a first control at a first time, such as 0.1 second into the simulation buildout, the simulation component 206 can determine a second control for the vehicle based on the first control determined by the vehicle. In this way, the simulation component 206 can provide functionality to "actively" consider possible controls at each instance of the simulation (e.g., over 8 seconds) similar to how a driver makes decisions when operating a vehicle. In some examples, the simulation com-ponent 206 can determine controls for both the vehicle 102 and the object 112 that are dependent upon previous controls and the subsequently updated state of the vehicle as time increases during the simulation.

In some examples, the control policy component 208 and integration component 210 may determine one or more of a control policy and/or controls (e.g., a steering control, a braking control, an acceleration control, and so on) and one or more future state(s) based thereon, respectively, for different time intervals over the time period during the simulation buildout. In a particular example, the control policy component 208 may determine a control policy and/or updated controls every five time intervals (e.g., every 0.5 seconds) for the eight second simulation buildout and the integration component 210 may determine a future state of the vehicle (e.g., based on the updated controls) each time interval (e.g., every 0.1 seconds) during the first second and every other time interval (e.g., every 0.2 seconds) for the next seven seconds during the eight second simulation buildout.

Such integration allows for more precise understanding of the interaction of the vehicle and the environment while following a predetermined action and/or switching between actions during exploration of a tree search. As a non-limiting example, and as illustrated in FIG. 2, the optimal trajectory for interacting with an agent may be one that switches between a stay-in-lane action and a turn left action, then returns to stay-in-lane. In such an instance, discretized integration provides a more realistic estimate of the intended path of the vehicle.

In some examples, after determining controls using the control policies and/or an updated state of the vehicle for a period of the eight second simulation (e.g., one second of simulation time), the updated state of the vehicle at the end of the period may be provided to a prediction component. The prediction component may utilize the updated state of the vehicle to predict changes to objects in the environment around the vehicle over the next time period (e.g., to determine the state of the environment at the end of the next time period). Examples are not so limited and the simulation component 206 may predict changes to objects in the environment around the vehicle over the time period in some examples. The simulation component 206 may utilize the updated environment in determining the control policy and/or actions for the vehicle 102 for a next time period. This may continue until the end of the eight second simulation buildout.

The control policy component 208 can comprise one or more of: a physics policy, a dynamics policy, a kinematics policy, and/or a rules policy indicating how the vehicle and objects can potentially interact or indicating information about rules of the road such as a right of way associated with a roadway, an intersection, or a navigable surface. In some examples, the buildout component 104 can implement a machine learned model that accesses a control policy output by the control policy component 208 to determine controls, trajectories, positions, or other data associated with the vehicle and/or object(s). For instance, a control policy output by the control policy component 208 can be used by a machine learned model during a simulation buildout performed by the simulation component 206. As mentioned above, the integration component 210 may determine a future state of the vehicle (e.g., based on the updated controls output by the control policy component 208 and/or a machine learned model utilizing a control policy output by the control policy component 208).

In the illustrated example of FIG. 2, as the vehicle 102 navigates in the environment at T0, the vehicle 112 may follow trajectory 118 to become closer to the vehicle 102 such that the control policy component 208 determines controls based on a control policy to avoid a collision at potential interaction 214 with the vehicle 102. For example, the control policy component 208 may determine, based on the control policy, different potential controls (e.g., a braking control, an acceleration control, and the like) for the vehicle 102 to avoid a collision with the vehicle 112. Though FIG. 2 depicts the simulation component 206 representing the vehicle acting relative to the vehicle 112, additional objects (whether or not associated with an intersection point) may also or instead be processed by the simulation component 206.

As illustrated in FIG. 2, the output of the simulation component 206 can include predicting the state of the environment at times T0, T1, . . . . TN (where N is an integer greater than 1) indicative of future states of the environment. For example, sensor data associated with the vehicle 102 can be used to perform the scenarios to identify potential objects that may intersect with the vehicle 102 at different times in the future. In one specific example, the scenarios may be performed for eight seconds in the future with potential operations of the simulation components at one-tenth second intervals. As mentioned above, the simulation of FIG. 2 may be performed for a "travel straight" action for the vehicle 102. As shown in FIG. 2, as time changes from time T0 to time T1, the vehicle 112 and the vehicle 102 are approaching one another according to the initial environment state data. At time T1, the control policy 208 of the simulation component 206 can determine controls for the vehicle 102 based at least in part on predicting the object trajectory 220 (e.g., which may be based on a predicted change in speed, acceleration, braking, etc.) associated with the vehicle 112. For instance, the controls determined by the control policy component 208 may include steering, accelerating, and/or braking to avoid the vehicle 112 relative to the object trajectory 220. The integration component 210 of the simulation component 206 may determine the predicted trajectory 216 of the vehicle 102 for the time period from T1 to T2 and an updated state of the vehicle 102 at T2 based on the controls output by the control policy component 208. At time T2, control policy component 208 of the simulation component 206 can determine the updated controls for the vehicle 102 based at least in part on the updated state of the vehicle 102 at T2 and updated environment data including updated data associated with the vehicle 112 (which may be based on data provided by a prediction component). The integration component 210 may then determine a predicted trajectory of the vehicle 102 for the time period from T2 to T3 and an updated state of the vehicle 102 at T3 based on the updated controls output by the control policy component 208. The control policy component 208 and integration component 210 may continue updating the scenario through the simulation time until TN (e.g., the last time interval of the simulation buildout). For instance, the control policy 208 can determine controls for the vehicle 102 based at least in part on the predicted object trajectory 222 (e.g., which may be based on a predicted change in speed, acceleration, braking, etc.) associated with the vehicle 112. For example, the controls determined by the control policy component 208 may include steering, accelerating, and/or braking to return the vehicle 112 to a straight path relative to the lane of travel because the vehicle 102 has successfully avoided the object 112 as determined when exploring the tree in a tree search. The integration component 210 of the simulation component 206 may determine the predicted trajectory 218 of the vehicle 102 for the time period from TN to TN+1 and an updated state of the vehicle 102 at TN+1 based on the controls output by the control policy component 208.

As discussed above and in more detail below regarding FIGS. 3A-6, the control policy component 208 and integration component 210 may operate at the same or different time intervals throughout the simulation buildout. This may include time intervals that differ between the components and/or time intervals that vary for one or both components over the course of the simulation buildout.

In the manner discussed above, prediction of objects in the environment may be performed iteratively and/or recursively (in which output is reinput into the model) for a number of times to achieve the desired total length of estimated time.

In various examples, the cost determination component 212 can determine a cost associated with a vehicle trajectory generated in the simulation buildout determined by the simulation component 206. For example, the cost determination component 212 can determine a reference cost, an obstacle cost, a steering cost, and/or an acceleration cost, and so on associated with the vehicle trajectories 216-218 and/or the object trajectories 220-222. In various examples, the costs associated with or otherwise determined by the cost determination component 212 can be used to select a candidate trajectory for the vehicle 102 (e.g., the planning component can receive a signal indicated the lowest aggregated costs representing a safest potential action). Additional examples of a vehicle architecture determining costs can be found, for example, in U.S. patent application Ser. No. 16/147,492 titled "Trajectory Generation and Optimization Using Closed-Form Numerical Integration in Route-Relative Coordinates" filed Sep. 28, 2018, the entirety of which is herein incorporated by reference in its entirety and for all purposes. Additional examples of a planning a route in an environment can be found, for example, in U.S. patent application Ser. No. 16/179,679 titled "Adaptive Scaling in Trajectory Generation" filed Nov. 2, 2018, the entirety of which is herein incorporated by reference in its entirety and for all purposes.

Figures 3A, 3B:
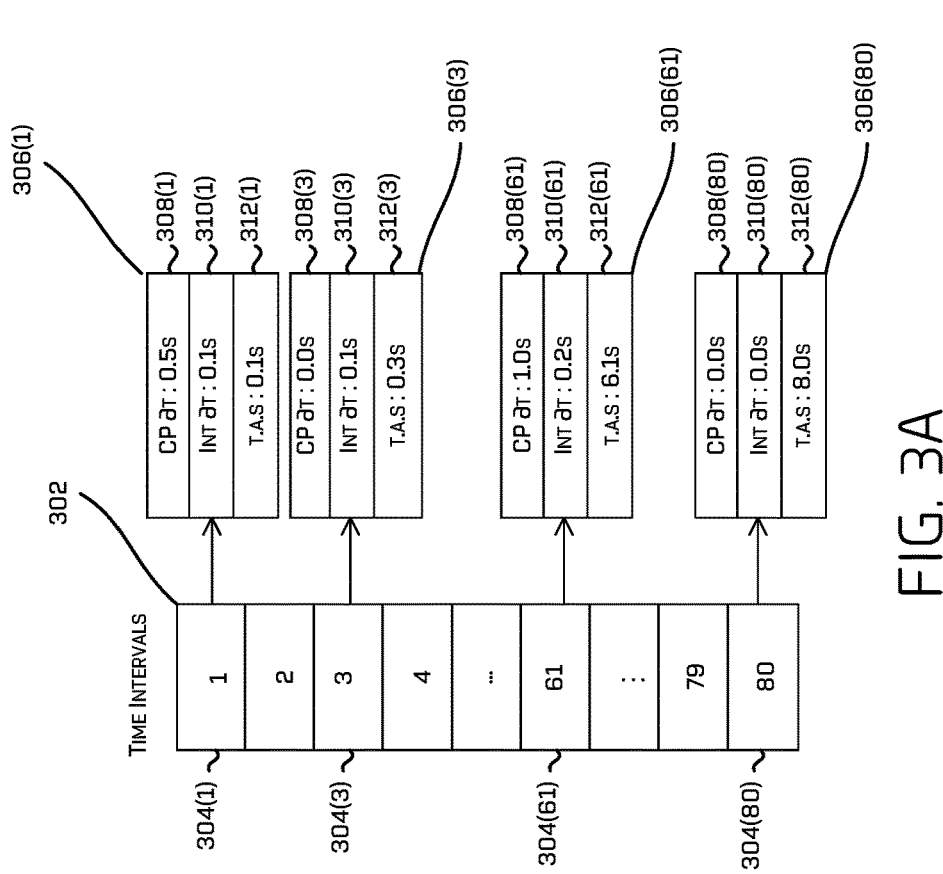
FIG. 3A is an illustration of an example dynamic time interval timing structure which may indicate the time intervals for a control policy component and an integration component.
FIG. 3B is an illustration of an example data structures that may define a dynamic interval timing of a simulation buildout for a buildout component.

FIG. 3A illustrates an example dynamic time interval timing structure 300 which may indicate the time intervals for a control policy component and integration component for a simulation buildout over an eight second simulation. In some examples, the dynamic time interval timing structure may also include information relating to the timing intervals of various other operations during a simulation buildout.

In some examples, the dynamic time interval timing structure 300 may include a list structure 302 that may include a respective entry 304 for each 0.1 second time interval of the eight second simulation buildout (e.g., 80 entries at which operations may be performed). Each entry 304 may include a link to a record 306. Each record 306 may include a control policy time interval (CP at) value 308, an integration time interval (Int at) value 310 and a time after step (T.A.S.) value 312. While entries in the records 306 are shown in time values, examples are not so limited. For examples, the records 306 may be stored as numbers of time intervals (or ticks, time steps and/or as tick counts).

In some examples, a nonzero value of the control policy time interval value 308, such as that in 308(1) and 308(6), may indicate that the control policy component 208 is to determine a control policy and/or controls for the associated time interval of the simulation buildout. A zero value of the control policy time interval value 308, such as that in 308(3) and 308(80), may indicate that a control policy component will not modify the control policy and/or controls of the vehicle in the associated time interval. For example, because the control policy time interval value 308(3) is zero, the control policy component will not be called during the simulation of the time interval from 0.2 seconds to 0.3 seconds while, as discussed below, the integration component may be called. Further, the value of the control policy time interval value 308 may indicate a time interval for which the determined control policy and/or controls may be maintained before a determination of a next control policy and/or controls by the control policy component 208. For example, a control policy and/or controls determined by the control policy component 208 for the step 304(1) may be determined based on the value 308(1) which indicates the control policy and/or controls will be in effect for 0.5 seconds with the next determination by the control policy component occurring for the sixth time interval 304(6) (e.g., from T=0.5-0.6 seconds). Similarly, a control policy and/or controls determined by the control policy component 208 for the step 304(61) may be determined based on the value 308(61) which indicates the control policy and/or controls will be in effect for 1.0 second. In this way, the dynamic time interval timing structure 302 may allow for the control policy time interval to vary with respect to the integration time interval and with respect to the entire simulation buildout.

Similarly, in some examples, a nonzero value of the integration time interval value 310, such as that in 310(1) and 310(61), may indicate that the integration component 210 is to perform integration during the respective tick to determine a future state of the vehicle based on the control policy and/or controls that are in effect. Further, the value of the integration time interval value 310 may indicate a time interval for the integration determined by the integration component. For example, the integration of the vehicle state determined by the integration component 210 for the step 304(1) may be determined based on the value 410(1) which indicates the integration should determine the change in the state of the vehicle for a 0.1 second time interval. Similarly, the integration of the vehicle state determined by the integration component 210 for the step 304(61) may be determined based on the value 310(61) which indicates the integration should determine the change in the state of the vehicle for a 0.2 second time interval. On the other hand, a zero value of the integration time interval value 310 (e.g., 310(80)), may indicate that integration will not be performed while performing the simulation buildout of the respective time interval. For example, if at time step 1, the integration time interval value 310 were 0.3 seconds, the integration performed for time interval 1 may integrate the current control policy and controls for the vehicle from T=0 to T=0.3 seconds. As such, the next two time intervals 2 and 3 (e.g., for times 0.1-0.2 seconds and 0.2-0.3 seconds) will not include an integration operation on the vehicle state which is already predicted for time interval 3 (e.g., which begins at 0.3 seconds). In this way, the dynamic tick interval timing structure 302 may allow for the integration time interval to vary with respect to the control policy time interval and with respect to the entire simulation buildout.

The time after step (T.A.S.) values 312(1)-312(80) may indicate the time at which the current step ends in the simulation buildout. For example, the time after step value 312(61) indicates that the step corresponding to entry 304 (61) and entry 306(61) may end at 6.1 seconds into the simulation buildout.

In some examples, the dynamic interval timing structure 302 may be used by multiple processing components, such as a central processing unit (CPU) and a graphics processing unit (GPU), in order to distribute the performance of various operations while maintaining timing between operations.

In some examples, the time intervals of the control policy component and the integration component may be aligned to match a timing of an environment update operation performed by a prediction component. For example, the buildout component 104 may provide the vehicle state data of the vehicle to a prediction component at the end of the integration operation for each second of the simulation buildout (e.g. at T=1 second, T=2 seconds, etc.). The prediction component may utilize the vehicle state data output by the buildout component at the end of the second to provide a predicted environment state of objects in the environment around vehicle for the next second. In a particular example, at the integration corresponding to step 10

(e.g., 302(10)) for the dynamic interval timing structure 302, the predicted vehicle state for the vehicle at one second after the start of the buildout determined by the integration component may be provided to the prediction component. The prediction component may utilize the state of the vehicle determined one second after the start of the simulation buildout to determine change(s) in the objects of the environment, from one (1) second after the start of the simulation buildout to two (2) seconds after the start of the simulation buildout. The prediction component may provide the updated environment state to the buildout component 104 for the control policy component and integration component operations corresponding to time intervals 304(11) to 304(20). This process may continue until the simulation buildout has completed.

In some examples, the buildout component 104 may determine an environment state for simulation buildout at time intervals between updates from the prediction component using interpolation. For example, the buildout component 104 may interpolate the environment state at 1.0 second and the environment state at 2.0 seconds to determine the environment states for determining the control policy and/or integration for steps 304(11) to 304(20) (e.g., for 1.1 seconds to 2.0 seconds).

In some examples, the dynamic time interval timing of the buildout component 104 may change dynamically during operation of the vehicle. The buildout component 104 may determine the dynamic time interval timing to use on a per simulation buildout basis, may determine a dynamic time interval timing at regular intervals, or may change a dynamic time interval timing in response to a trigger. For example, changes in the time intervals may be triggered by a change in condition of the vehicle, an input from a user, a change in the environment or so on.

FIG. 3B illustrates example data structures 350 that may define a dynamic time interval timing of a simulation buildout for a buildout component. In the illustrated examples, the data structures may include information relating to the timing intervals of operations of a control policy component and an integration component during a simulation buildout. More particularly, the data structures 350 may include a control policy step timing 352 and an integration step timing 354.

As illustrated, the control policy step timing 352 may include control policy timing for different portions of the simulation buildout. More particularly, a record for control policy timing of a portion of the simulation buildout may include a value for the duration of the portion 356, a number of steps of the portion 358 and an interval of the steps of the portion 360. For example, the control policy step timing 352 of FIG. 3B may include a one second portion that has 10 steps of 0.1 seconds, a 2 second portion that has 10 steps of 0.2 seconds, a two second portion that has four steps of 0.5 seconds and a three second portion that has three steps of one second. As such, in operations in which control policy step timing 352 were utilized, the occurrence of control policy determinations by the control policy component decreases over the course of the simulation buildout. Such an example may save processing and power resources.

Similarly, the integration step timing 354 may include integration timings for different portions of the simulation buildout. More particularly, a record for integration timing of a portion of the simulation buildout may include a value for the duration of the portion 362, a number of steps of the portion 364 and an interval of the steps of the portion 366. For example, the integration step timing 354 of FIG. 3B may include a one second portion that has 10 steps of 0.1 seconds and a 7 second portion that has 35 steps of 0.2 seconds. As such, in operations in which integration step timing 354 were utilized, the occurrence of integration by the integration component decreases over the course of the simulation buildout. Such an example may save processing and power resources. Further, as shown, the step timing of the control policy component and the integration component may be different.

As discussed above, the buildout component 104 may change between different dynamic timing interval timings throughout operation. In some examples, the buildout component may access a data store including multiple data structures (e.g., multiple structures 352 and/or 354) of dynamic time interval timings. Further, one or more of the data structures for the dynamic time interval timings may include conditions or triggers for their use in operations.

Further, in examples in which multiple candidate trajectories are generated by the simulation buildout, the dynamic timing intervals for the different candidate trajectories being generated may be the same or different depending on the circumstances in the buildout of that particular candidate trajectory. These and other variations would be apparent to one of ordinary skill in the art in view of this disclosure.

While described as a separate system, in some examples, techniques to evaluate trajectories described herein in relation to FIGS. 1-3B may be implemented by other vehicle systems, components, and/or computing devices. For example, and as will be described in further detail with regard to FIG. 4, the prediction techniques described herein in relation to FIGS. 1-3B may be implemented at least partially by or in association with a perception component, a planning component, and/or a model component of FIG. 4.

Figure 4:
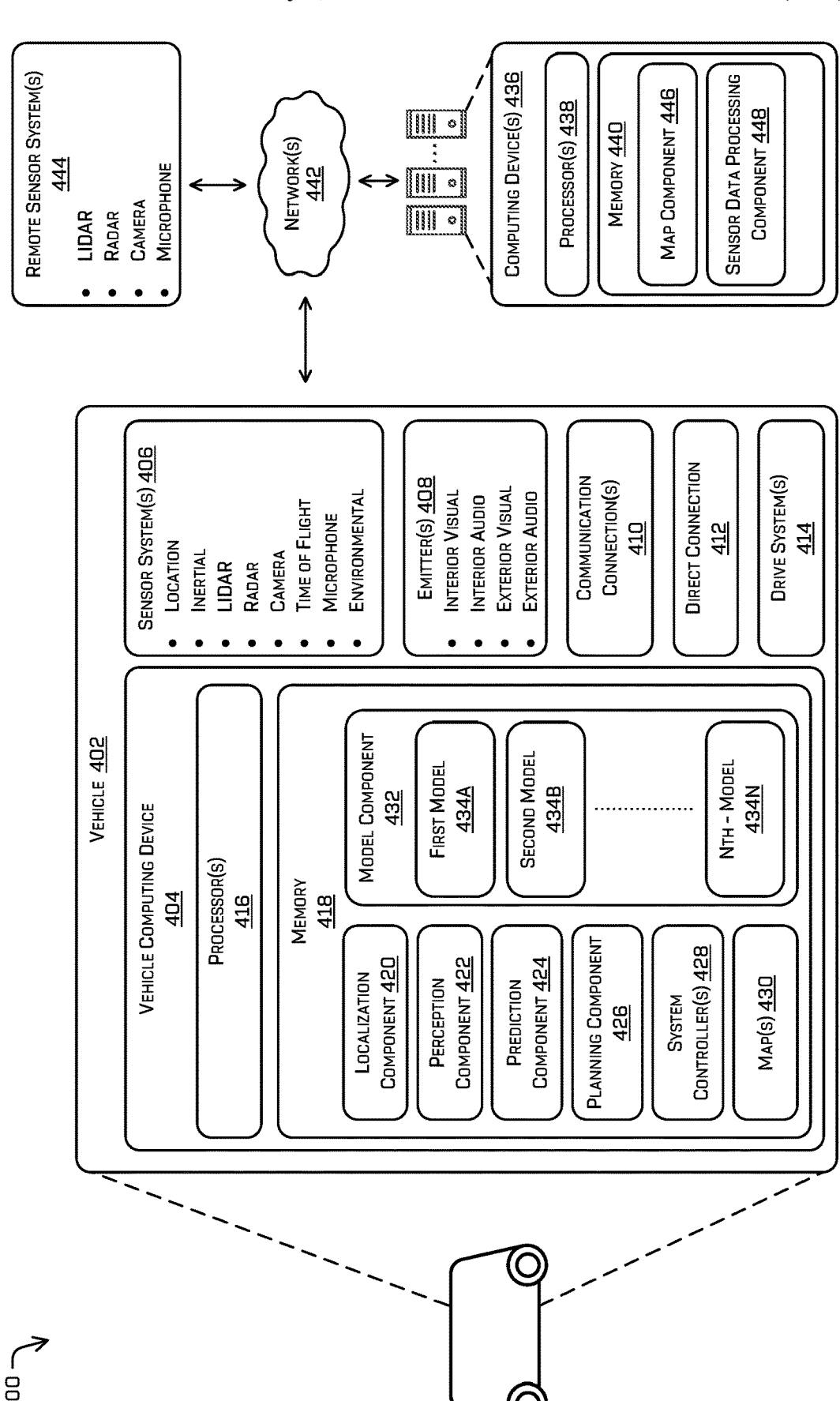
FIG. 4 is a block diagram of an example system for implementing the techniques described herein.

FIG. 4 is a block diagram of an example system 400 for implementing the techniques described herein. In at least one example, the system 400 may include a vehicle, such as vehicle 402.

The vehicle 402 may include a vehicle computing device 404, one or more sensor systems 406, one or more emitters 408, one or more communication connections 410, at least one direct connection 412, and one or more drive system(s) 414.

The vehicle computing device 404 may include one or more processors 416 and memory 418 communicatively coupled with the one or more processors 416. In the illustrated example, the vehicle 402 is an autonomous vehicle; however, the vehicle 402 could be any other type of vehicle, such as a semi-autonomous vehicle, or any other system having at least an image capture device (e.g., a camera enabled smartphone). In some instances, the autonomous vehicle 402 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the autonomous vehicle 402 may be a fully or partially autonomous vehicle having any other level or classification.

In various examples, the vehicle computing device 404 may store sensor data associated with actual location of an object at the end of the set of estimated states (e.g., end of the period of time) and may use this data as training data to train one or more models. In some examples, the vehicle computing device 404 may provide the data to a remote computing device (i.e., computing device separate from vehicle computing device such as the computing device(s) 436) for data analysis. In such examples, the remote computing device(s) may analyze the sensor data to determine an actual location, velocity, direction of travel, or the like of the object at the end of the set of estimated states. Additional details of training a machine learned model based on stored sensor data by minimizing differences between actual and predicted positions and/or predicted trajectories is described in U.S. patent application Ser. No. 16/282,201, filed on Mar. 12, 2019, entitled "Motion Prediction Based on Appearance," which is incorporated herein by reference in its entirety and for all purposes.

In the illustrated example, the memory 418 of the vehicle computing device 404 stores a localization component 420, a perception component 422, a prediction component 424, a planning component 426, one or more system controllers 428, one or more maps 430, and a model component 432 including one or more model(s), such as a first model 434A, a second model 434B, up to an Nth model 434N (collectively "models 434"), where N is an integer. Though depicted in FIG. 4 as residing in the memory 418 for illustrative purposes, it is contemplated that the localization component 420, the perception component 422, the prediction component 424, the planning component 426, one or more system controllers 428, one or more maps 430, and/or the model component 432 including the model(s) 434 may additionally, or alternatively, be accessible to the vehicle 402 (e.g., stored on, or otherwise accessible by, memory remote from the vehicle 402, such as, for example, on memory 440 of a remote computing device 436).

In at least one example, the localization component 420 may include functionality to receive data from the sensor system(s) 406 to determine a position and/or orientation of the vehicle 402 (e.g., one or more of an x-, y-, z-position, roll, pitch, or yaw). For example, the localization component 420 may include and/or request/receive a map of an environment, such as from map(s) 430 and/or map component 446, and may continuously determine a location and/or orientation of the autonomous vehicle within the map. In some instances, the localization component 420 may utilize SLAM (simultaneous localization and mapping), CLAMS (calibration, localization and mapping, simultaneously), relative SLAM, bundle adjustment, non-linear least squares optimization, or the like to receive image data, lidar data, radar data, IMU data, GPS data, wheel encoder data, and the like to accurately determine a location of the autonomous vehicle. In some instances, the localization component 420 may provide data to various components of the vehicle 402 to determine an initial position of an autonomous vehicle for determining the relevance of an object to the vehicle 402, as discussed herein.

In some instances, the perception component 422 may include functionality to perform object detection, segmentation, and/or classification. In some examples, the perception component 422 may provide processed sensor data that indicates a presence of an object (e.g., entity) that is proximate to the vehicle 402 and/or a classification of the object as an object type (e.g., car, pedestrian, cyclist, animal, building, tree, road surface, curb, sidewalk, unknown, etc.). In some examples, the perception component 422 may provide processed sensor data that indicates a presence of a stationary entity that is proximate to the vehicle 402 and/or a classification of the stationary entity as a type (e.g., building, tree, road surface, curb, sidewalk, unknown, etc.). In additional or alternative examples, the perception component 422 may provide processed sensor data that indicates one or more features associated with a detected object (e.g., a tracked object) and/or the environment in which the object is positioned. In some examples, features associated with an object may include, but are not limited to, an x-position (global and/or local position), a y-position (global and/or local position), a z-position (global and/or local position), an orientation (e.g., a roll, pitch, yaw), an object type (e.g., a classification), a velocity of the object, an acceleration of the object, an extent of the object (size), etc. Features associated with the environment may include, but are not limited to, a presence of another object in the environment, a state of another object in the environment, a time of day, a day of a week, a season, a weather condition, an indication of darkness/light, etc.

The prediction component 424 can generate one or more probability maps representing prediction probabilities of possible locations of one or more objects in an environment. For example, the prediction component 424 can generate one or more probability maps for vehicles, pedestrians, animals, and the like within a threshold distance from the vehicle 402. In some instances, the prediction component 424 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

In some examples, the prediction component 424 may generate predicted trajectories of objects (e.g., objects) in an environment and/or to generate predicted candidate trajectories for the vehicle 402. For example, the prediction component 424 may generate one or more predicted trajectories for objects within a threshold distance from the vehicle 402. In some examples, the prediction component 424 may measure a trace of an object and generate a trajectory for the object based on observed and predicted behavior.

In general, the planning component 426 may determine a path for the vehicle 402 to follow to traverse through an environment. For example, the planning component 426 may determine various routes and trajectories and various levels of detail. For example, the planning component 426 may determine a route to travel from a first location (e.g., a current location) to a second location (e.g., a target location). For the purpose of this discussion, a route may include a sequence of waypoints for travelling between two locations. As non-limiting examples, waypoints include streets, intersections, global positioning system (GPS) coordinates, etc. Further, the planning component 426 may generate an instruction for guiding the autonomous vehicle along at least a portion of the route from the first location to the second location. In at least one example, the planning component 426 may determine how to guide the autonomous vehicle from a first waypoint in the sequence of waypoints to a second waypoint in the sequence of waypoints. In some examples, the instruction may be a candidate trajectory, or a portion of a trajectory. In some examples, multiple trajectories may be substantially simultaneously generated (e.g., within technical tolerances) in accordance with a receding horizon technique. A single path of the multiple paths in a receding data horizon having the highest confidence level may be selected to operate the vehicle. In various examples, the planning component 426 can select a trajectory for the vehicle 402 based at least in part on receiving data representing an output of the model component 432.

In other examples, the planning component 426 can alternatively, or additionally, use data from the localization component 420, the perception component 422, and/or the prediction component 424 to determine a path for the vehicle 402 to follow to traverse through an environment. For example, the planning component 426 can receive data from the localization component 420, the perception component 422, and/or the prediction component 424 regarding objects associated with an environment. Using this data, the planning component 426 can determine a route to travel from a first location (e.g., a current location) to a second location (e.g., a target location) to avoid objects in an environment. In at least some examples, such a planning component 426 may determine there is no such collision free path and, in turn, provide a path which brings vehicle 402 to a safe stop avoiding all collisions and/or otherwise mitigating damage. Additionally or alternatively, the planning component 426 can determine the path for the vehicle 402 to follow based at least in part on data received from the simulation component 206 and/or the cost determination component 212 as described in FIG. 3 and elsewhere.

In at least one example, the vehicle computing device 404 may include one or more system controllers 428, which may be configured to control steering, propulsion, braking, safety, emitters, communication, and other systems of the vehicle 402. The system controller(s) 428 may communicate with and/or control corresponding systems of the drive system(s) 414 and/or other components of the vehicle 402.

The memory 418 may further include one or more maps 430 that may be used by the vehicle 402 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map may include, but is not limited to: texture information (e.g., color information (e.g., RGB color information, Lab color information, HSV/HSL color information), and the like), intensity information (e.g., lidar information, radar information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map may include a three-dimensional mesh of the environment. In some examples, the vehicle 402 may be controlled based at least in part on the map(s) 430. That is, the map(s) 430 may be used in connection with the localization component 420, the perception component 422, the prediction component 424, and/or the planning component 426 to determine a location of the vehicle 402, detect objects in an environment, generate routes, determine actions and/or trajectories to navigate within an environment.

In some examples, the one or more maps 430 may be stored on a remote computing device(s) (such as the computing device(s) 436) accessible via network(s) 442. In some examples, multiple maps 430 may be stored based on, for example, a characteristic (e.g., type of entity, time of day, day of week, season of the year, etc.). Storing multiple maps 430 may have similar memory requirements, but increase the speed at which data in a map may be accessed.

As illustrated in FIG. 4, the vehicle computing device 404 may include a model component 432. The model component 432 may be configured to perform the functionality of the buildout component 104, including predicting a likelihood of object intersections, such as with the objects 110, 112, and 114 of FIG. 1. In various examples, the model component 432 may receive one or more features associated with the detected object(s) from the perception component 422 and/ or from the sensor system(s) 406. In some examples, the model component 432 may receive environment characteristics (e.g., environmental factors, etc.) and/or weather characteristics (e.g., weather factors such as snow, rain, ice, etc.) from the perception component 422 and/or the sensor system(s) 406. While shown separately in FIG. 4, the model component 432 could be part of the prediction component 424, the planning component 426, or other component(s) of the vehicle 402.

The model component 432 may perform those functions discussed herein, such as those described above with respect to FIGS. 1-3B.

As can be understood, the components discussed herein (e.g., the localization component 420, the perception component 422, the prediction component 424, the planning component 426, the one or more system controllers 428, the one or more maps 430, the model component 432 including the model(s) 434 are described as divided for illustrative purposes. However, the operations performed by the various components may be combined or performed in any other component.

While examples are given in which the techniques described herein are implemented by a planning component and/or a model component of the vehicle, in some examples, some or all of the techniques described herein could be implemented by another system of the vehicle, such as a secondary safety system. Generally, such an architecture can include a first computing device to control the vehicle 402 and a secondary safety system that operates on the vehicle 402 to validate operation of the primary system and to control the vehicle 402 to avoid collisions.

In some instances, aspects of some or all of the components discussed herein may include any models, techniques, and/or machine learned techniques. For example, in some instances, the components in the memory 418 (and the memory 440, discussed below) may be implemented as a neural network.

As described herein, an exemplary neural network is a technique which passes input data through a series of connected layers to produce an output. Each layer in a neural network may also comprise another neural network, or may comprise any number of layers (whether convolutional or not). As can be understood in the context of this disclosure, a neural network may utilize machine learning, which may refer to a broad class of such techniques in which an output is generated based on learned parameters.

Although discussed in the context of neural networks, any type of machine learning may be used consistent with this disclosure. For example, machine learning techniques may include, but are not limited to, regression techniques (e.g., ordinary least squares regression (OLSR), linear regression, logistic regression, stepwise regression, multivariate adaptive regression splines (MARS), locally estimated scatterplot smoothing (LOESS)), instance-based techniques (e.g., ridge regression, least absolute shrinkage and selection operator (LASSO), elastic net, least-angle regression (LARS)), decisions tree techniques (e.g., classification and regression tree (CART), iterative dichotomiser 3 (ID3), Chi-squared automatic interaction detection (CHAID), decision stump, conditional decision trees), Bayesian techniques (e.g., naïve Bayes, Gaussian naïve Bayes, multinomial naïve Bayes, average one-dependence estimators (AODE), Bayesian belief network (BNN), Bayesian networks), clustering techniques (e.g., k-means, k-medians, expectation maximization (EM), hierarchical clustering), association rule learning techniques (e.g., perceptron, back-propagation, hopfield network, Radial Basis Function Network (RBFN)), deep learning techniques (e.g., Deep Boltzmann Machine (DBM), Deep Belief Networks (DBN), Convolutional Neural Network (CNN), Stacked Auto-Encoders), Dimensionality Reduction Techniques (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Techniques (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet50, ResNet101, VGG, DenseNet, PointNet, and the like.

In at least one example, the sensor system(s) 406 may include lidar sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 406 may include multiple instances of each of these or other types of sensors. For instance, the lidar sensors may include individual lidar sensors located at the corners, front, back, sides, and/or top of the vehicle 402. As another example, the camera sensors may include multiple cameras disposed at various locations about the exterior and/or interior of the vehicle 402. The sensor system(s) 406 may provide input to the vehicle computing device 404. Additionally, or in the alternative, the sensor system(s) 406 may send sensor data, via the one or more networks 442, to the one or more computing device(s) 436 at a particular frequency, after a lapse of a predetermined period of time, in near real-time, etc.

The vehicle 402 may also include one or more emitters 408 for emitting light and/or sound. The emitter(s) 408 may include interior audio and visual emitters to communicate with passengers of the vehicle 402. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 408 may also include exterior emitters. By way of example and not limitation, the exterior emitters may include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 402 may also include one or more communication connections 410 that enable communication between the vehicle 402 and one or more other local or remote computing device(s). For instance, the communication connection(s) 410 may facilitate communication with other local computing device(s) on the vehicle 402 and/or the drive system(s) 414. Also, the communication connection(s) 410 may allow the vehicle to communicate with other nearby computing device(s) (e.g., remote computing device 436, other nearby vehicles, etc.) and/or one or more remote sensor system(s) 444 for receiving sensor data. The communications connection(s) 410 also enable the vehicle 402 to communicate with a remote teleoperations computing device or other remote services.

The communications connection(s) 410 may include physical and/or logical interfaces for connecting the vehicle computing device 404 to another computing device or a network, such as network(s) 442. For example, the communications connection(s) 410 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.) or any suitable wired or wireless communications protocol that enables the respective computing device to interface with the other computing device(s).

In at least one example, the vehicle 402 may include one or more drive systems 414. In some examples, the vehicle 402 may have a single drive system 414. In at least one example, if the vehicle 402 has multiple drive systems 414, individual drive systems 414 may be positioned on opposite ends of the vehicle 402 (e.g., the front and the rear, etc.). In at least one example, the drive system(s) 414 may include one or more sensor systems to detect conditions of the drive system(s) 414 and/or the surroundings of the vehicle 402. By way of example and not limitation, the sensor system(s) may include one or more wheel encoders (e.g., rotary encoders) to sense rotation of the wheels of the drive modules, inertial sensors (e.g., inertial measurement units, accelerometers, gyroscopes, magnetometers, etc.) to measure orientation and acceleration of the drive module, cameras or other image sensors, ultrasonic sensors to acoustically detect objects in the surroundings of the drive module, lidar sensors, radar sensors, etc. Some sensors, such as the wheel encoders may be unique to the drive system(s) 414. In some cases, the sensor system(s) on the drive system(s) 414 may overlap or supplement corresponding systems of the vehicle 402 (e.g., sensor system(s) 406).

The drive system(s) 414 may include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 414 may include a drive module controller which may receive and preprocess data from the sensor system(s) and to control operation of the various vehicle systems. In some examples, the drive module controller may include one or more processors and memory communicatively coupled with the one or more processors. The memory may store one or more modules to perform various functionalities of the drive system(s) 414. Furthermore, the drive system(s) 414 may also include one or more communication connection(s) that enable communication by the respective drive module with one or more other local or remote computing device(s).

In at least one example, the direct connection 412 may provide a physical interface to couple the one or more drive system(s) 414 with the body of the vehicle 402. For example, the direct connection 412 may allow the transfer of energy, fluids, air, data, etc. between the drive system(s) 414 and the vehicle. In some instances, the direct connection 412 may further releasably secure the drive system(s) 414 to the body of the vehicle 402.

In at least one example, the localization component 420, the perception component 422, the prediction component 424, the planning component 426, the one or more system controllers 428, the one or more maps 430, and the model component 432, may process sensor data, as described above, and may send their respective outputs, over the one or more network(s) 442, to the computing device(s) 436. In at least one example, the localization component 420, the perception component 422, the prediction component 424, the planning component 426, the one or more system controllers 428, the one or more maps 430, and the model component 432 may send their respective outputs to the remote computing device(s) 436 at a particular frequency, after a lapse of a predetermined period of time, in near real-time, etc.

In some examples, the vehicle 402 may send sensor data to the computing device(s) 436 via the network(s) 442. In some examples, the vehicle 402 may receive sensor data from the computing device(s) 436 and/or remote sensor system(s) 444 via the network(s) 442. The sensor data may include raw sensor data and/or processed sensor data and/or representations of sensor data. In some examples, the sensor data (raw or processed) may be sent and/or received as one or more log files.

The computing device(s) 436 may include processor(s) 438 and a memory 440 storing the map component 446 and a sensor data processing component 448. In some examples, the map component 446 may include functionality to generate maps of various resolutions. In such examples, the map component 446 may send one or more maps to the vehicle computing device 404 for navigational purposes. In various examples, the sensor data processing component 448 may be configured to receive data from one or more remote sensors, such as sensor system(s) 406 and/or remote sensor system(s) 444. In some examples, the sensor data processing component 448 may be configured to process the data and send processed sensor data to the vehicle computing device 404, such as for use by the model component 432 (e.g., the model(s) 434). In some examples, the sensor data processing component 448 may be configured to send raw sensor data to the vehicle computing device 404.

The processor(s) 416 of the vehicle 402 and the processor(s) 438 of the computing device(s) 436 may be any suitable processor capable of executing instructions to process data and perform operations as described herein. By way of example and not limitation, the processor(s) 416 and 438 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

Memory 418 and memory 440 are examples of non-transitory computer-readable media. The memory 418 and memory 440 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

It should be noted that while FIG. 4 is illustrated as a distributed system, in alternative examples, components of the vehicle 402 may be associated with the computing device(s) 436 and/or components of the computing device(s) 436 may be associated with the vehicle 402. That is, the vehicle 402 may perform one or more of the functions associated with the computing device(s) 436, and vice versa.

Figure 5:
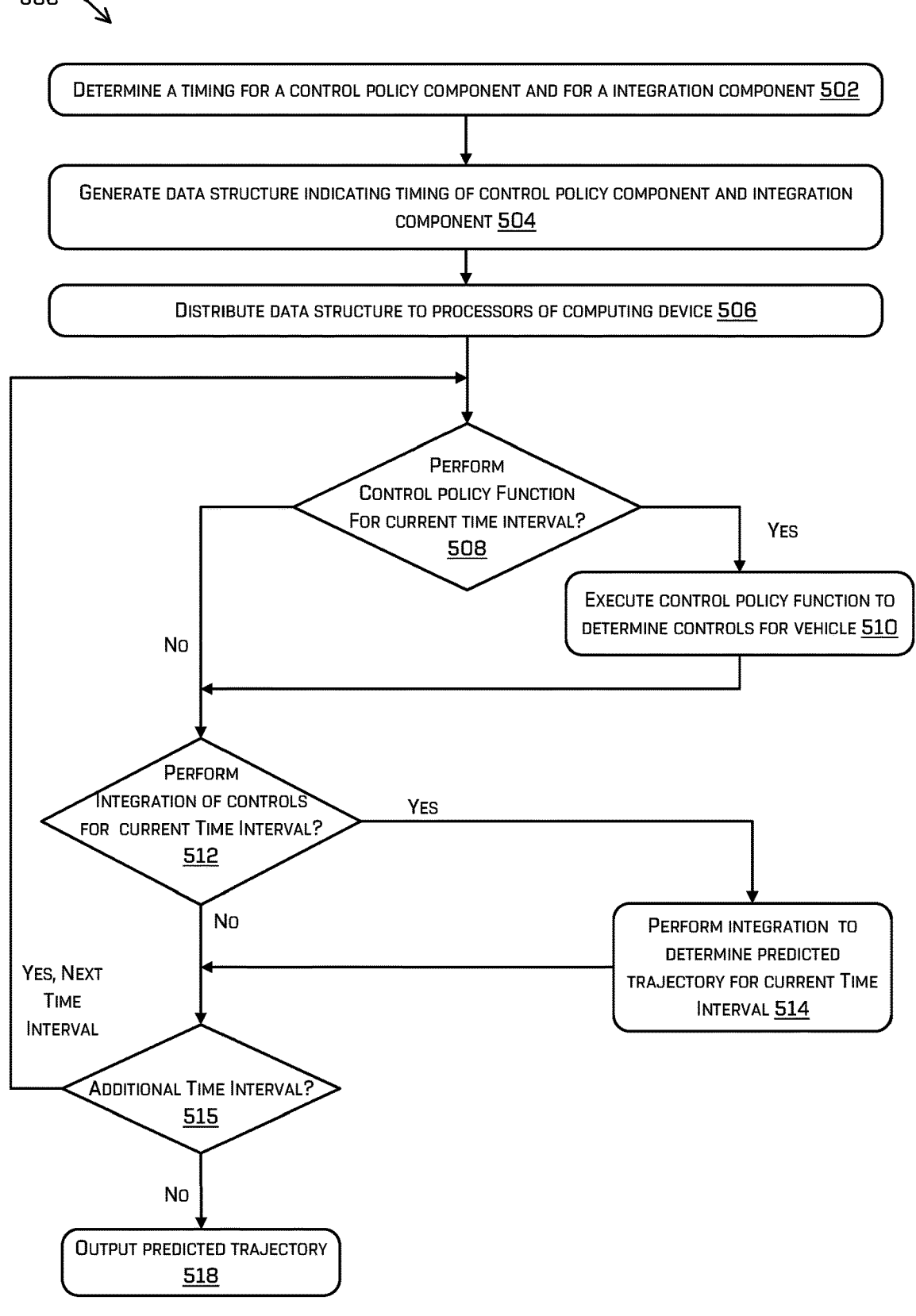
FIG. 5 is an illustration of a flowchart depicting an example process for determining a predicted trajectory using dynamic time intervals.

FIG. 5 is a flowchart depicting an example process 500 for determining a predicted trajectory using simulation buildout with dynamic time intervals. For example, some or all of the process 500 can be performed by one or more components in FIG. 4, as described herein. For example, some or all of the process 500 can be performed by the vehicle computing device 404 or the computing device 202.

At operation 502, the process may include determining a set of timings for a control policy component and for an integration component. For example, the buildout component may determine a set of timings for the control policy component and for an integration component based on the condition of the vehicle, an input from a user, environment data or so on. The process may then include generating a dynamic tick interval timing structure based on the determined timings. As discussed above with respect to FIG. 3A, the dynamic tick interval timing structure may indicate a timing for operations of the control policy component and integration component. Then, at 506, the process may include distributing the dynamic tick interval timing structure to #one or more processors of the computing device involved in simulation buildout.

At 508, the process may include determining whether to perform a control policy function of the control policy component for the current time interval to modify a control policy and/or determine controls of the vehicle. If so, the process may continue to 510. Otherwise, the process may continue to 512. At 510, the process may include the control policy component executing the control policy function for the current time interval. For example, the control policy component may utilize the current state of the vehicle and other objects as well as rules of the road, right of way logic, physics, kinematics, dynamics, and the like to modify a control policy and/or determine controls for controlling the vehicle.

At 512, the process may include determining whether to perform integration function of the integration component for the current time interval. If so, the process may continue to 514. Otherwise, the process may continue to 516. At 514, the process may include the integration component performing integration to determine a future state of the vehicle relative to the current time interval of the simulation.

At 516, the process may include determining whether additional time intervals remain for the simulation buildout. If so, the process may return to 510 for the next tick. Otherwise, the process may continue to 518.

At 518, the process may include outputting the predicted trajectory for the simulation buildout (e.g., for an eight second simulation).

FIG. 6 is a flowchart depicting an example process 600 for controlling a vehicle based on a candidate trajectory determined using dynamic timing intervals. For example, some or all of the process 600 can be performed by one or more
components in FIG. 4, as described herein. For example,
some or all of the process 600 can be performed by the
vehicle computing device 404 or the computing device 202.

At operation 602, the process may include receiving
vehicle state data of a vehicle. At operation 604, the process
may include receiving receive an action of the vehicle and
an initial environment state.

At operation 606, the process may include determining a
predicted trajectory for the action based at least in part on the
initial environment state, a set of control policy intervals for
a control policy function and a set of integration intervals for
an integration operation.

At operation 608, the process may include determining a
candidate trajectory for the vehicle based at least in part on
the predicted trajectory.

At operation 610, the process may include controlling the
vehicle in an environment based at least in part on the
candidate trajectory.

FIGS. 5-6 illustrate example processes in accordance with examples of the disclosure. These processes are illustrated as
logical flow graphs, each operation of which represents a
sequence of operations that can be implemented in hard-
ware, software, or a combination thereof. In the context of
software, the operations represent computer-executable
instructions stored on one or more computer-readable stor-
age media that, when executed by one or more processors,
perform the recited operations. Generally, computer-execut-
able instructions include routines, programs, objects, com-
ponents, data structures, and the like that perform particular
functions or implement particular abstract data types. The
order in which the operations are described is not intended
to be construed as a limitation, and any number of the
described operations can be omitted and/or combined in any
order and/or in parallel to implement the processes.

The methods described herein represent sequences of
operations that can be implemented in hardware, software,
or a combination thereof. In the context of software, the
blocks represent computer-executable instructions stored on
one or more computer-readable storage media that, when
executed by one or more processors, perform the recited
operations. Generally, computer-executable instructions
include routines, programs, objects, components, data struc-
tures, and the like that perform particular functions or
implement particular abstract data types. The order in which
the operations are described is not intended to be construed
as a limitation, and any number of the described operations
can be combined in any order and/or in parallel to implement
the processes. In some examples, one or more operations of
the method may be omitted entirely. For instance, the
operations may include determining a first action and a
second action by the vehicle relative to a selected trajectory
without determining a respective cost for one or more of the
actions by the vehicle. Moreover, the methods described
herein can be combined in whole or in part with each other
or with other methods.

The various techniques described herein may be imple-
mented in the context of computer-executable instructions or
software, such as program modules, that are stored in
computer-readable storage and executed by the processor(s)
of one or more computing devices such as those illustrated
in the figures. Generally, program modules include routines,
programs, objects, components, data structures, etc., and
define operating logic for performing particular tasks or
implement particular abstract data types.

Other architectures may be used to implement the
described functionality and are intended to be within the scope of this disclosure. Furthermore, although specific
distributions of responsibilities are defined above for pur-
poses of discussion, the various functions and responsibili-
ties might be distributed and divided in different ways,
depending on circumstances.

Similarly, software may be stored and distributed in
various ways and using different means, and the particular
software storage and execution configurations described
above may be varied in many different ways. Thus, software
implementing the techniques described above may be dis-
tributed on various types of computer-readable media, not
limited to the forms of memory that are specifically
described.

EXAMPLE CLAUSES

Any of the example clauses in this section may be used
with any other of the example clauses and/or any of the other
examples or embodiments described herein.

A. A system comprising: one or more processors; and one
or more non-transitory computer-readable media storing
instructions executable by the one or more processors,
wherein the instructions, when executed, cause the system to
perform operations comprising: receiving vehicle state data
of a vehicle; receiving an action for the vehicle to perform;
receiving a control policy; receiving a set of control policy
intervals; receiving a set of integration intervals; determin-
ing, for a first control policy interval of the set of control
policy intervals and based at least in part on the action and
the control policy, a modified control policy; integrating, for
a period of time based on the first control policy interval and
based at least in part on the modified control policy and a
first integration interval of the set of integration intervals, an
updated vehicle state and an updated object state; and
controlling the vehicle in an environment based at least in
part on the an updated vehicle state and an updated object
state.

B. The system of clause A, wherein: the control policy
indicates at least one of a physics policy, a dynamics policy,
a kinematics policy, or a right of way policy, and the right
of way policy associated with one or more of a roadway, an
intersection, or a surface navigable by the vehicle.

C. The system of clause A, wherein determining the
modified control policy is based at least in part on predicting
that controlling the vehicle in accordance with the control
policy is associated with at least a threshold probability of
colliding with an object proximate the vehicle.

D. The system of clause C, wherein the threshold prob-
ability of colliding with an object is based at least in part on
recursively determining a predicted state of the object and a
state of the vehicle.

E. The system of clause A, wherein at least one of: the first
control policy interval differs from a second control policy
interval of the set of control policy intervals, or a first
integration interval of the set of integration intervals differs
from a second integration interval of the set of integration
intervals.

F. The system of clause A, wherein one or more of the first
control policy interval or an integration interval of the set of
integration intervals is based at least in part on one or more
of: a user input; a number of objects proximate the vehicle;
an object classification of an object proximate the vehicle;
an agent speed; geolocation; a power supply state of the
vehicle; a temperature of a vehicle component; a speed of
the vehicle; a proximity to an agent; or a risk assessment.

G. The system of clause A, wherein subsequent integration intervals of the set of integration intervals increase with respect to previous integration intervals.

H. A method comprising: receiving vehicle state data of a vehicle; receiving an action for the vehicle to perform, the action associated with a set of controls; receiving a data structure defining a set of control policy intervals and a set of integration intervals; determining, for a first control policy interval of the set of control policy intervals and based at least in part on the action, a modified control; and integrating, for a period of time based at least in part on the modified control and a first integration interval of the set of integration intervals, an updated vehicle state and an updated object state.

I. The method of clause H, further comprising: determining the modified control is based at least in part on predicting that controlling the vehicle in accordance with a first control of the set of controls is associated with at least a threshold probability of colliding with an object proximate the vehicle.

J. The method of clause I, wherein the threshold probability of colliding with an object is based at least in part on recursively determining a predicted state of the object and a state of the vehicle.

K. The method of clause H, wherein: the action comprises one or more of: continue along a lane, change lanes, or make a turn.

L. The method of clause K, further comprising: distributing the data structure defining the set of control policy intervals and the set of integration intervals to a plurality of parallel processing units, wherein a first parallel processing unit determines the updated vehicle state and the updated object state associated with the action; and determining, by a second parallel processing unit of the plurality of parallel processing units, a second updated vehicle state and a second updated object state associated with a second action based on the data structure defining the set of control policy intervals and the set of integration intervals.

M. The method of clause H, wherein: the first control policy interval differs from a second control policy interval of the set of control policy intervals, or a first integration interval of the set of integration intervals differs from a second integration interval of the set of integration intervals.

N. One or more non-transitory computer-readable media storing instructions executable by one or more processors, wherein the instructions, when executed, cause the one or more processors to perform operations comprising: receiving vehicle state data of a vehicle; receiving an action for the vehicle to perform, the action comprising a set of controls; receiving a data structure defining a set of control policy intervals and a set of integration intervals; determining, for a first control policy interval of the set of control policy intervals and based at least in part on the action, a modified control; and integrating, for a period of time based at least in part on the modified control and a first integration interval of the set of integration intervals, the one or more of an updated vehicle state or an updated object state.

O. The one or more non-transitory computer-readable media of clause N, wherein the integrating comprises using at least one of: a physics policy, a dynamics policy, a kinematics policy, or a right of way policy, the right of way policy associated with one or more of: a roadway, an intersection, or a surface navigable by the vehicle.

P. The one or more non-transitory computer-readable media of clause N, further comprising: determining the modified control is based at least in part on predicting that controlling the vehicle in accordance with a control of the set of controls is associated with at least a threshold probability of colliding with an object proximate the vehicle.

Q. The one or more non-transitory computer-readable media of clause P, wherein: wherein the threshold probability of colliding with an object is based at least in part on recursively determining a predicted state of the object and a state of the vehicle.

R. The one or more non-transitory computer-readable media of clause Q, wherein at least one of: the first control policy interval differs from a second control policy interval of the set of control policy intervals, or a first integration interval of the set of integration intervals differs from a second integration interval of the set of integration intervals.

S. The one or more non-transitory computer-readable media of clause R, wherein one or more of the first control policy interval or an integration interval of the set of integration intervals is based at least in part on one or more of: a user input; a number of objects proximate the vehicle; an object classification of an object proximate the vehicle; an agent speed; geolocation; a power supply state of the vehicle; a temperature of a vehicle component; a speed of the vehicle; a proximity to an agent; or a risk assessment.

T. The one or more non-transitory computer-readable media of clause N, wherein subsequent integration intervals of the set of integration intervals increase with respect to previous integration intervals.

While the example clauses described above are described with respect to one particular implementation, it should be understood that, in the context of this document, the content of the example clauses can also be implemented via a method, device, system, computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A method comprising:
   receiving vehicle state data of a vehicle;
   receiving an action for the vehicle to perform, the action associated with a set of controls;

receiving a first data structure defining a set of control policy intervals and second data structure defining a set of integration intervals;

determining, for a first control policy interval of the set of control policy intervals and based at least in part on the action, a modified control; and integrating, for a period of time based at least in part on the modified control and a first integration interval of the set of integration intervals, an updated vehicle state and an updated object state.

2. The method of claim 1, further comprising:

determining the modified control based at least in part on predicting that controlling the vehicle in accordance with a first control of the set of controls is associated with at least a threshold probability of colliding with an object proximate the vehicle.

3. The method of claim 2, wherein the threshold probability of colliding with the object is based at least in part on recursively determining a predicted state of the object and a state of the vehicle.

4. The method of claim 1, wherein:

the action comprises one or more of:

continue along a lane, change lanes, or make a turn.

5. The method of claim 1, further comprising:

distributing the first data structure defining the set of control policy intervals and the second data structure defining the set of integration intervals to a plurality of parallel processing units, wherein a first parallel processing unit determines the updated vehicle state and the updated object state associated with the action; and determining, by a second parallel processing unit of the plurality of parallel processing units, a second updated vehicle state and a second updated object state associated with a second action based on the first data structure defining the set of control policy intervals and the second data structure the set of integration intervals.

6. The method of claim 1, wherein at least one of:

the first control policy interval differs from a second control policy interval of the set of control policy intervals, or the first integration interval of the set of integration intervals differs from a second integration interval of the set of integration intervals.

7. One or more non-transitory computer-readable media storing instructions executable by one or more processors, wherein the instructions, when executed, cause the one or more processors to perform operations comprising:

receiving vehicle state data of a vehicle;

receiving an action for the vehicle to perform, the action comprising a set of controls;

receiving a first data structure defining a set of control policy intervals and a second data structure a set of integration intervals;

determining, for a first control policy interval of the set of control policy intervals and based at least in part on the action, a modified control; and integrating, for a period of time based at least in part on the modified control and a first integration interval of the set of integration intervals, one or more of an updated vehicle state or an updated object state.

8. The one or more non-transitory computer-readable media of claim 7, wherein the integrating comprises using at least one of: a physics policy, a dynamics policy, a kinematics policy, or a right of way policy, the right of way policy associated with one or more of: a roadway, an intersection, or a surface navigable by the vehicle.

9. The one or more non-transitory computer-readable media of claim 7, the operations further comprising:

determining the modified control based at least in part on predicting that controlling the vehicle in accordance with a control of the set of controls is associated with at least a threshold probability of colliding with an object proximate the vehicle.

10. The one or more non-transitory computer-readable media of claim 9, wherein:

wherein the threshold probability of colliding with the object is based at least in part on recursively determining a predicted state of the object and a state of the vehicle.

11. The one or more non-transitory computer-readable media of claim 10, wherein at least one of:

the first control policy interval differs from a second control policy interval of the set of control policy intervals, or the first integration interval of the set of integration intervals differs from a second integration interval of the set of integration intervals.

12. The one or more non-transitory computer-readable media of claim 11, wherein one or more of the first control policy interval or an integration interval of the set of integration intervals is based at least in part on one or more of:

a user input;

a number of objects proximate the vehicle;

an object classification of the object proximate the vehicle;

an agent speed;

geolocation;

a power supply state of the vehicle;

a temperature of a vehicle component;

a speed of the vehicle;

a proximity to an agent; or a risk assessment.

13. The one or more non-transitory computer-readable media of claim 7, wherein subsequent integration intervals of the set of integration intervals increase with respect to previous integration intervals.

14. A system comprising:

one or more processors; and one or more non-transitory computer-readable media storing instructions executable by the one or more processors, wherein the instructions, when executed, cause the system to perform operations comprising:

receiving vehicle state data of a vehicle;

receiving an action for the vehicle to perform, the action associated with a set of controls;

receiving a first data structure defining a set of control policy intervals and second data structure defining a set of integration intervals;

determining, for a first control policy interval of the set of control policy intervals and based at least in part on the action, a modified control; and integrating, for a period of time based at least in part on the modified control and a first integration interval of the set of integration intervals, an updated vehicle state and an updated object state.

15. The system of claim 14, the operations further comprising:

determining the modified control based at least in part on predicting that controlling the vehicle in accordance with a first control of the set of controls is associated with at least a threshold probability of colliding with an object proximate the vehicle.

16. The system of claim 15, wherein the threshold probability of colliding with the object is based at least in part on recursively determining a predicted state of the object and a state of the vehicle.

17. The system of claim 14, wherein:
the action comprises one or more of:
continue along a lane,
change lanes, or
make a turn.

18. The system of claim 14, the operations further comprising:
distributing the first data structure defining the set of control policy intervals and the second data structure defining the set of integration intervals to a plurality of parallel processing units, wherein a first parallel processing unit determines the updated vehicle state and the updated object state associated with the action; and determining, by a second parallel processing unit of the plurality of parallel processing units, a second updated vehicle state and a second updated object state associated with a second action based on the first data structure defining the set of control policy intervals and the second data structure the set of integration intervals.

19. The system of claim 14, wherein at least one of:
the first control policy interval differs from a second control policy interval of the set of control policy intervals, or
a first integration interval of the set of integration intervals differs from a second integration interval of the set of integration intervals.

20. The system of claim 14, wherein the integrating comprises using at least one of: a physics policy, a dynamics policy, a kinematics policy, or a right of way policy, the right of way policy associated with one or more of: a roadway, an intersection, or a surface navigable by the vehicle.

* * * * *